(12) United States Patent
Mancini et al.

(10) Patent No.: US 6,992,371 B2
(45) Date of Patent: Jan. 31, 2006

(54) DEVICE INCLUDING AN AMORPHOUS CARBON LAYER FOR IMPROVED ADHESION OF ORGANIC LAYERS AND METHOD OF FABRICATION

(75) Inventors: David P. Mancini, Fountain Hills, AZ (US); Jaime A. Quintero, Tempe, AZ (US); Doug J. Resnick, Gilbert, AZ (US); Steven M. Smith, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/892,693

(22) Filed: Jul. 16, 2004

(65) Prior Publication Data

US 2005/0079650 A1    Apr. 14, 2005

Related U.S. Application Data

(60) Provisional application No. 60/510,275, filed on Oct. 9, 2003.

(51) Int. Cl.
*H01L 23/48* (2006.01)
*H01L 23/42* (2006.01)
*H01L 29/40* (2006.01)

(52) U.S. Cl. .............. 257/642; 257/753; 257/751; 257/752; 438/642

(58) Field of Classification Search .......... 257/642, 257/743, 744, 745, 750, 753; 438/642, 644, 438/645, 648
See application file for complete search history.

(56) References Cited

U.S. PATENT DOCUMENTS

5,112,448 A * 5/1992 Chakravorty ............ 205/118
5,550,405 A * 8/1996 Cheung et al. ........... 257/642
6,582,856 B1 * 6/2003 Quek et al. ................. 430/5

OTHER PUBLICATIONS

Wilson et al., "Surface relaxation in liquid water and methanol studied by x-ray absorption spectroscopy," The Journal of Chemical Physics, vol. 117, Issue 16, pp. 7738-7744 (Oct. 22, 2002).*

Mori et al, "Development of polymer-molding-releasing metal mold surfaces with perfluorinated-group-containing polymer plating" Journal of Applied Polymer Science, (2003) vol. 90, No. 9, pp 2549-2556.*

* cited by examiner

*Primary Examiner*—Minhloan Tran
*Assistant Examiner*—Thomas L. Dickey
(74) *Attorney, Agent, or Firm*—Kim-Marie Vo

(57) ABSTRACT

A novel device, such as a semiconductor device, a microfluidic device, a surface acoustic wave device an imprint template, or the like, including an amorphous carbon layer for improved adhesion of organic layers and method of fabrication. The device includes a substrate having a surface, an amorphous carbon layer, formed overlying the surface of the substrate, and a low surface energy material layer overlying the surface of the substrate. The device is formed by providing a substrate having a surface, depositing a low surface energy material layer and an amorphous carbon layer overlying the surface of the substrate adjacent the low surface energy material layer using plasma enhanced chemical vapor deposition (PECVD) or sputtering.

32 Claims, 2 Drawing Sheets

DEVICE INCLUDING AN AMORPHOUS CARBON LAYER FOR IMPROVED ADHESION OF ORGANIC LAYERS AND METHOD OF FABRICATION

This application claims benefit of Provisional application No. 60/510,275 filed Oct. 9, 2003.

FIELD OF THE INVENTION

The present invention relates to semiconductor processing techniques, and more particularly to an electronic device, such as a semiconductor device, having improved adhesion qualities and a method for fabricating the device including enhanced adhesion of organic layers.

BACKGROUND OF THE INVENTION

Organic material layer adhesion, in the form of photoresist adhesion, to substrates having a layer of low surface energy material such as Teflon AF® present on the surface, and the adhesion of low surface energy materials to a substrate surface, is very poor using current methodology. The result is a reduction in the quality of photolithography processing, and the inability to incorporate low surface energy materials into the layers of a multi-layer device. There have been several attempts to improve the adhesion of organic materials, such as photoresists, to the surface of various substrates having as a top surface a low surface energy material present. Absent any pretreatments, organic photoresist materials will not wet low surface energy surfaces, and so do not coat these surfaces in a way that facilitates patterning. While many surface pretreatment options have been utilized, these conventional procedures have failed to demonstrate the adhesive durability required to complete all necessary processing steps. Some of these procedures produce an effect which is very transitory in nature, while with others, photoresist layers have been observed to peel away from wafer surfaces during development steps or during immersion in cleaning solutions such as an ammonium hydroxide ($NH_4OH$) solution (10% in water). This $NH_4OH$ solution is commonly used to clean the wafer surfaces prior to subsequent processing steps such as etches or depositions.

Several attempts have been made recently with respect to pretreatment options to modify the surfaces in an effort to promote resist adhesion. These options have included, dehydration bakes, application of both i-line and DUV anti-reflective coatings used as thin film interlayers, standard HMDS vapor priming, and the application of several silane based organic coupling agents. However, none of these processes has improved adhesion adequately.

The current industry standard process used as a means to prepare silicon wafers for resist coating is to vapor prime wafer surfaces with hexamethyldisilizane (HMDS). However, HMDS is only chemically compatible with silicon and its oxides and does not react in the same manner with most other materials. On a silicon surface, HMDS applies, from the vapor phase, an organic monolayer which is repellant to water or other aqueous solutions such as developers or $NH_4OH$. The water repellant nature of the film at the substrate/resist interface maintains enough surface energy to permit resist to stick and form a film, but prevents the lifting of resist films during subsequent aqueous processing such as developing or cleaning. It is known that the contact angle of water on a surface is a good measure of the surface energy and water repellency of that surface. The contact angle of a water droplet on a properly HMDS-primed silicon surface typically measures between 65–72°. It has additionally been found that traditional vapor priming lasts only three days until the wafers must be primed again. In addition, during the vapor priming process, wafers are typically brought to a temperature of 150° C. for a period exceeding 30 minutes. This is objectionable for certain temperature sensitive applications, and as previously stated, vapor priming with HMDS has no effect on most low surface energy materials such as Teflon or other fluoropolymers.

As previously stated, other methods exist to promote adhesion of organic materials to surfaces of the wafer, more specifically surfaces of the low surface energy material. One such method, often used to modify surfaces which are inert to vapor priming, is to use a chemical vapor deposition (CVD) process to apply a thin (<500 A) layer of a second material such as silicon nitride (SiN) or silicon oxide (SiO) to the surface. The deposition of this material when coupled with traditional HMDS vapor priming, provides for excellent adhesion of the resist layer to the wafer surface. However, such coatings must be later removed which can present additional problems. For example, it has been found that removal of the SiN material, generally through dry etching techniques, is very aggressive and can lead to damage of a fragile wafer epi layer.

Still other methods exist to promote adhesion of photoresist to wafers, such as using oxygen plasma to roughen and add oxygen to the surface prior to coating the surface with resist. This process temporarily raises surface energy, but results in only a transient effect since low surface energy functional groups in the molecule re-migrate to the surface restoring its original low level of energy. In addition, the surface roughness remains which may not be desirable. In the instance where amorphous Teflon AF® is used, the oxygen plasma roughens the Teflon AF® surface, and promotes increased adhesion, but allows for resist solvents to attack the Teflon AF®. It has additionally, been proposed to utilize surfactants mixed with the photoresist materials to aid in surface wetting. The process is complicated and requires double resist coats since wetting by the first coating usually remains incomplete. Typically, 10–15% of the surfactant is needed relative to the resist, yet results in only an 80% coverage with a first coat.

Lastly, other materials have been used as interfacial adhesion promoters. Aluminum has been used, yet aluminum etches in the resist developer, thereby limiting resolution.

Accordingly, it is an object of the present invention to provide for a device, such as a semiconductor device, a photonic device, a microfluidic device, an acoustic wave device, an imprint template, or the like that includes an interfacial material that promotes enhanced adhesion of a photoresist to a low surface energy material or enhanced adhesion of a low surface energy material to a substrate.

It is a further object of the present invention to provide for a device that includes an interfacial material that promotes enhanced adhesion in which subsequent removal of the resist and interfacial layer does not damage the underlying material surface.

It is a further object of the present invention to provide for a device that includes an interfacial material that promotes enhanced adhesion and allows use of the resist layer in a conventional way coupled with a conventional etch process to pattern the low surface energy layer.

It is yet another object of the present invention to provide for a method of fabricating a device including the steps of providing for an interfacial material that promotes enhanced adhesion of a photoresist to a low surface energy material or enhanced adhesion of a low surface energy material to a substrate.

SUMMARY OF THE INVENTION

These needs and others are substantially met through provision of a device and a method of fabricating the device including a substrate, a low surface energy material layer, and an amorphous carbon layer disposed overlying the substrate and adjacent the low surface energy material layer. The method of fabricating the device includes the steps of providing a substrate having a surface, depositing a low surface energy material layer overlying the substrate, and depositing an amorphous carbon layer overlying the surface of the substrate, but adjacent the low surface energy material layer. The amorphous carbon layer is formed utilizing standard plasma enhanced chemical vapor deposition techniques (PECVD) or by sputtering.

BRIEF DESCRIPTION OF THE DRAWINGS

The foregoing and further and more specific objects and advantages of the present invention will become readily apparent to those skilled in the art from the following detailed description of a preferred embodiment thereof taken in conjunction with the drawings, in which.

DETAILED DESCRIPTION OF THE PREFERRED EMBODIMENTS

Figure 1:
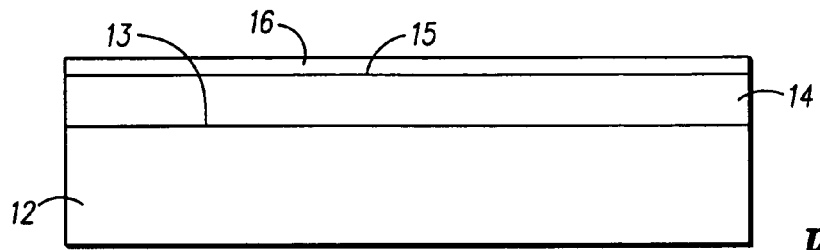
FIGS. 1–6 illustrate cross-sectional views of the steps in fabricating a first embodiment of a semiconductor device including an amorphous carbon layer for improved adhesion of a photoresist to a low surface energy material layer according to the present invention.

During the course of this description, like numbers are used to identify like elements according to the different figures that illustrate the invention. In addition, during the course of the description of the preferred embodiments, a semiconductor device is described, yet it is anticipated by this disclosure that the term "device" may include a semiconductor device, a photonic device, a microfluidic device, an acoustic wave device, an imprint template, or the like. Accordingly, FIG. 1 illustrates in simplified cross-sectional view a first step in the method of fabricating a device, namely a semiconductor device, according to the present invention. Illustrated in FIG. 1 is a semiconductor device, generally referenced 10, including as a first step the providing of a substrate 12. In this particular embodiment, substrate 12 is described as being formed of silicon or a silicon oxide material. More specifically, substrate 12 is described as being formed of silicon. It should be understood, that anticipated by this disclosure is the fabrication of substrate 12 of a III–V material, such as GaAs, InGaAs, InAlAs or any similar material, or any other materials commonly utilized as semiconductor substrates, including but not limited to silicon, silicon containing materials, certain metals and metal oxides.

Substrate 12, has disposed on an upper surface 13, a low surface energy material layer 14. Low surface energy material layer 14 is typically formed of Teflon AF®, but is also disclosed as formed in the alternative of an amorphous or semi-crystalline fluoropolymer, parylene, silicone-based materials, such as Dow bisbenzocyclobutene (Dow BCB), which includes a silicone component (poly dimethylsiloxane) to its structure, or the like. Low surface energy material layer 14 is provided on surface 13 of substrate 12 in this particular embodiment to provide surface 13 with unique properties that are inherent to low surface energy materials, such as water repellency, inertness, low stick/high releasability, high electrical resistance, and for the purpose of protecting surface 12 from abrasion, contamination, or other foreign matter. Low surface energy material layer 14 is typically found to be difficult to wet, the result being that nothing will stick to or coat it. This prevents the use of low surface energy materials in many instances where they might be beneficial, such as a low-k material, non-stick mask coatings, MEMS devices, microfluidics, patterning layers for Step and Flash Imprint Lithography (SFIL) technology, or the like. To increase wettability and improve adhesion, a layer of amorphous carbon 16 is deposited on an uppermost surface 15 of low surface energy material layer 14. It is disclosed that amorphous carbon layer 16 is formed of an amorphous carbon material which is disposed on surface 15 of low surface energy material layer 14, using typical semiconductor deposition techniques. More specifically, amorphous carbon layer 16 is deposited on surface 15 of low surface energy material layer 14 using plasma enhanced chemical vapor deposition (PECVD) or by sputtering. It should be understood that amorphous carbon layer 16 when deposited utilizing plasma enhanced chemical vapor deposition (PECVD) techniques may contain other elements such as hydrogen, nitrogen, or oxygen. Amorphous carbon layer 16 provides for enhanced adhesion between substrate 12 and a photoresist (discussed presently).

Carbon layer 16 is disclosed as formed of a thin layer of amorphous carbon.

Amorphous carbon layer 16 in this preferred embodiment is deposited at a thickness of less than 100 Å, preferably with a thickness of 30–70 Å, using standard PECVD techniques or by sputtering, well known in the industry. This deposition of amorphous carbon layer 16 results in an improved adhesive durability of a subsequently deposited photoresist, to low surface energy material layer 14, allowing low surface energy material 14 to be processed and patterned with conventional photoresist and etching processing techniques.

Figure 2:
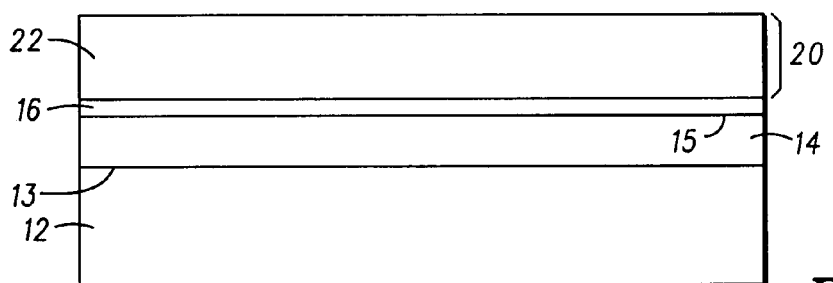
Figure 3:
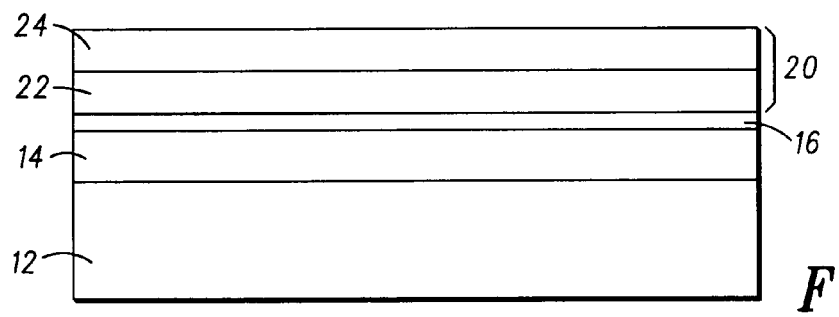

Referring now to FIGS. 2 and 3, the wafer stack, generally referenced 10, is next coated with an organic photoresist stack 20. Organic photoresist stack 20 may consist of one or more layers of photo-imageable organic photoresist layers, including those materials that are optically and/or electron beam sensitive. As illustrated in FIG. 2, organic photoresist stack 20 is formed as a standard single layer resist, including photoresist layer 22. As illustrated in FIG. 3, in the alternative, organic photoresist stack 20 is formed as a multi-layer resist, such as a standard bilayer resist, including photoresist layers 22 and 24. It should be understood, that resist stack 20, irrespective of being formed as a single resist stack, or a multi-layer resist stack, can be formed to include either a positive resist or a negative resist, dependent upon the desired pattern.

Figure 4:
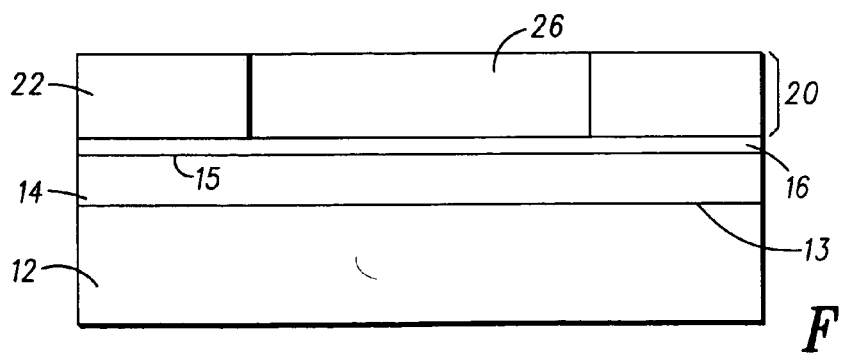
Figure 5:
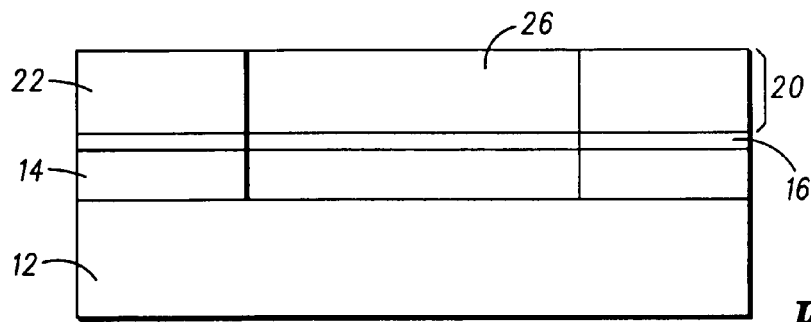

As illustrated in FIG. 4, wafer stack 10, and more specifically, resist stack 20, is next exposed and patterned using standard lithographic methods, such as electron beam, optical, or the like, and then developed with an appropriate wet chemical developer. As illustrated, an area 26 of stack 20 is removed during the development process, thereby forming the pattern.

Next, the completely developed wafer stack 10 is etched for approximately one minute in an oxygen plasma to remove a portion of amorphous carbon layer 16 exposed during the patterning steps and provide for subsequent etch steps. Stack 10 is next etched for approximately 1–10 minutes in oxygen to remove a portion of low surface energy material layer 14. Stack 10 is then optionally soaked in a 10% $NH_4OH$ solution for a duration of typically 1 to 5 minutes. The soaking of stack 10 in the $NH_4OH$ solution provides for the cleaning of the exposed surface 13 of substrate 12 prior to subsequent steps, i.e. etch, metallization, or the like. The criteria for measuring adhesive strength and durability is a ten minute soak in 10% ammonium hydroxide ($NH_4OH$) aqueous solution at room temperature. During this immersion time, no lifting or undercutting of even the smallest, typically sub-micron, resist features should occur.

Figure 6:
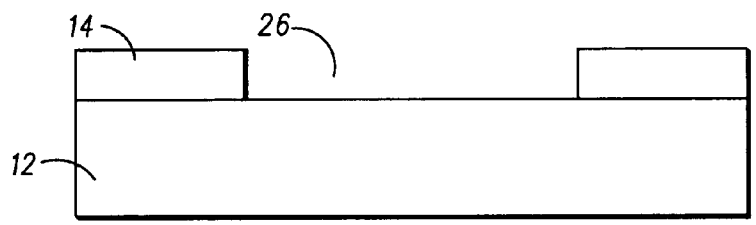

Typically amorphous carbon layer 16 is deposited in approximately 15 seconds and is easily removed by low or zero bias oxygen plasma. As illustrated in FIG. 6, following the next desired processes, organic resist stack 20, and amorphous carbon layer 16 are removed. This step of removal may be done by techniques including wet chemical dissolution or oxygen plasma ashing or with combinations thereof. Samples of patterned wafers using a carbon layer and either a single or bilayer resist stack as disclosed herein, were developed for minute and immersed in a 10% ammonium hydroxide solution for 10 minutes.

Examination of the patterned resist using a scanning electron microscope (SEM) microscope revealed that the resist did not lift nor did its profile show any signs of delamination or undercutting. As a result it is concluded that the inclusion of amorphous carbon layer 16 results in surface 15 of low surface energy material layer 14 being well suited for adhesion of organic photoresist stack 20.

It is anticipated by this disclosure that carbon layer 16 is formed of an amorphous carbon, deposited on surface 15 of low surface energy material layer 14 at a thickness of less than 200 Å, but it should be understood that layer 16 can have a thickness in the range of 30 Å to 10,000 Å. In the preferred embodiment, carbon layer 16 is formed at a thickness of between 30–70 Å. Two types of amorphous carbon are disclosed as suitable for fabrication of carbon layer 16. More particularly a polymer-like carbon material (PLC) and a diamond-like carbon (DLC) material, are disclosed for carbon layer 16. In a preferred embodiment, polymer-like carbon material is described as being ~60% polymeric, containing an appreciable amount of hydrogen, having a low density value of ~0.9 g/cc, a hardness value of ~2.0 GPa and optical constant data of n~1.7 and k~0.02 at 633 nm. Diamond-like carbon material is described as being 35% polymeric, containing an appreciable amount of other elements such as nitrogen and hydrogen, and may even contain oxygen, having a higher density value of ~1.4 g/cc, a hardness value of ~8.0 GPa, and optical constant data of n~1.9 and k~0.20 at 633 nm. Although specific carbon films falling between the description of PLC and DLC were not tested, it is believed they will work equally as well in this application. Amorphous carbon layer 16 provides for enhanced adhesion of photoresist stack 20 to the surface 15 of low surface energy material layer 14 by altering the surface energy of low surface material layer 14, so as to provide greater compatibility with photoresist stack 20, while simultaneously repelling water or aqueous mixtures.

Figure 7:
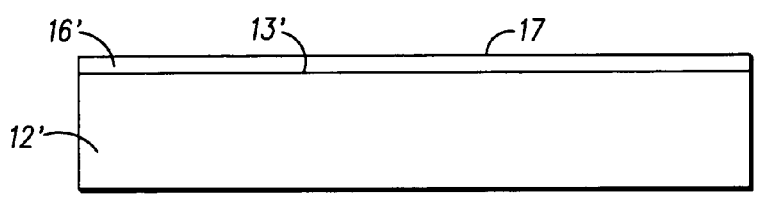
FIGS. 7–8 illustrate cross-sectional views of the steps in fabricating a second embodiment of a semiconductor device including an amorphous carbon layer for improved adhesion of a low surface energy material layer to a substrate according to the present invention.
Figure 8:
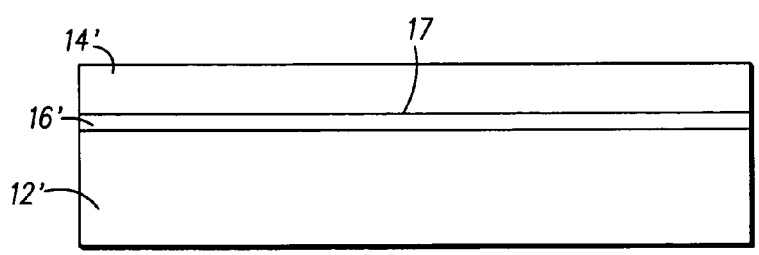

In an alternate embodiment, as illustrated in FIGS. 7 and 8, amorphous carbon layer 16' is formed on an uppermost surface of substrate 12', and low surface energy material layer 14' is formed on an uppermost surface of amorphous carbon layer 16'. It should be noted that all components similar to the components illustrated in FIG. 1, are designated with similar numbers, having a prime added to indicate the different embodiment.

More specifically, illustrated in a second embodiment is a device in which it is desired to deposit a low surface energy material 14' onto substrate 12'. To promote adhesion of low surface energy material 14' to substrate 12', amorphous carbon layer 16' is deposited overlying and adjacent substrate 12', prior to the deposition of low surface energy material 14'. This type of application would be beneficial with low-K materials, non-stick mask coatings, MEMS devices, microfluidics, and patterning layers of SFIL devices.

As illustrated in FIGS. 7 and 8, substrate 12' is provided and formed of similar materials as those disclosed for substrate 12 of FIGS. 1–6. Next, a layer 16' of amorphous carbon is disposed overlying substrate 12' and adjacent to an uppermost surface 13' of substrate 12'. Amorphous carbon layer 16' is disclosed as formed of similar materials as those disclosed for amorphous carbon layer 16 of FIGS. 1–6 and provides for enhanced adhesion of low surface energy material 14' overlying substrate 12'. Low surface energy material layer 14' is formed in this particular embodiment of Teflon AF®, but it is anticipated that it could be formed of other low surface energy material layers as described with respect to FIGS. 1–6.

In this particular embodiment, during fabrication of device 10', a thin layer of less than 100 Å of amorphous carbon is deposited on surface 13' of substrate 12' using PECVD or other techniques as previously disclosed. It is anticipated by this disclosure that layer 16' is typically formed less than 200 Å, but it should be understood that layer 16' can have a thickness in the range of 30 Å to 10,000 Å.

A layer of low surface energy material 14' is deposited or spin coated on top of amorphous carbon layer 16'. The use of amorphous carbon as an interfacial layer provides for enhanced adhesion of low surface energy material 14' to substrate 12'.

Thus, an amorphous carbon layer for improved adhesion of organic layers and method of fabrication is disclosed. The inclusion of an amorphous carbon layer provides for enhanced adhesion of a resist layer to a low surface energy material surface or enhanced adhesion of a low surface energy material layer to a substrate. This enhancement of the adhesion properties provides for improved fabrication of semiconductor devices, photonic devices, microfluidic devices, surface acoustic wave devices, imprint templates, or the like, including the facilitation of patterning said low surface energy material and ease with which removal of resist layers is achieved.

What is claimed is:

1. A device comprising:
   a substrate having a surface;
   a low surface energy material layer formed overlying the surface of the substrate, wherein said low surface energy material layer has a surface energy less than or equal to about 18 millijoules/square meter; and
   an amorphous carbon layer, formed overlying the surface of the substrate and adjacent the low surface energy material layer.

2. A device as claimed in claim 1 wherein the amorphous carbon layer is formed between the low surface energy material layer and the substrate.

3. A device as claimed in claim 1 wherein the low surface energy material is formed between the surface of the substrate and the amorphous carbon layer, and a photoresist stack is formed on an uppermost surface of the amorphous carbon layer.

4. A device as claimed in claim 3 wherein the photoresist stack is formed as a multi-layer photoresist.

5. A device as claimed in claim 1 wherein the substrate is formed of one of a silicon material or a III–V material.

6. A device as claimed in claim 5 wherein the substrate is formed of GaAs.

7. A device as claimed in claim 5 wherein the substrate is formed of InAlAs.

8. A device as claimed in claim 5 wherein the substrate is formed of InGaAs.

9. A device as claimed in claim 1 wherein the substrate is formed of a metal.

10. A device as claimed in claim 1 wherein the substrate is formed of a silicon containing material.

11. A device as claimed in claim 1 wherein the low surface energy material is from the group consisting of an amorphous fluoropolymer, a semi-crystalline fluoropolymer, a parylene, and a silicone-based material.

12. A device as claimed in claim 1 wherein the amorphous carbon layer is formed of a polymer-like carbon.

13. A device as claimed in claim 1 wherein the amorphous carbon layer is formed of a diamond-like carbon.

14. A device comprising:
a substrate having a surface;
a low surface energy material layer formed overlying the surface of the substrate, wherein said low surface energy material layer has a surface energy less than or equal to about 18 millijoules/square meter;
a plasma enhanced chemical vapor deposited amorphous carbon layer, formed adjacent an uppermost surface of the low surface energy material layer; and
a photoresist stack formed adjacent an uppermost surface of the amorphous carbon layer.

15. A device as claimed in claim 14 wherein the amorphous carbon layer is formed of a polymer-like carbon.

16. A device as claimed in claim 14 wherein the amorphous carbon layer is formed of a diamond-like carbon.

17. A device comprising:
a substrate having a surface;
a plasma enhanced chemical vapor deposited amorphous carbon layer, formed adjacent the surface of the substrate;
a low surface energy material layer formed adjacent an uppermost surface of the amorphous carbon layer.

18. A device as claimed in claim 17 wherein the amorphous carbon layer is formed of a polymer-like carbon.

19. A device as claimed in claim 17 wherein the amorphous carbon layer is formed of a diamond-like carbon.

20. A method of forming a device comprising the steps of:
providing a substrate having a surface;
forming a low surface energy material layer formed overlying the surface of the substrate, wherein said low surface energy material layer has a surface energy less than or equal to about 18 millijoules/square meter;
depositing an amorphous carbon layer overlying the surface of the substrate and adjacent the low surface energy material.

21. A method of forming a device as claimed in claim 20 wherein the step of forming a layer of low surface energy material includes forming the layer of low surface energy material between the substrate and the amorphous carbon layer, and forming a photoresist stack on an uppermost surface of the amorphous carbon layer.

22. The method of forming a device as claimed in claim 21 wherein the step of forming a photoresist stack on an uppermost surface of the amorphous carbon layer includes forming a multi-layer resist stack.

23. A method of forming a device as claimed in claim 21 further including the step of patterning the photoresist stack to form a patterned photoresist stack, and utilizing the patterned photoresist stack to pattern the low surface energy material layer.

24. A method of forming a device as claimed in claim 23 further including the steps of patterning the resist stack using standard lithographic techniques thereby forming a photoresist mask, etching through the carbon film layer and the low surface energy material using remaining the photoresist mask, removing the remaining photoresist mask by etching or by dissolving in a developer, and etching to remove the remaining carbon film, thereby exposing a patterned low surface energy material layer on the surface of the substrate.

25. A method of forming a device as claimed in claim 20 wherein the step of forming a layer of carbon includes forming the layer of carbon between the substrate and the low surface energy material layer.

26. A method of forming a device as claimed in claim 20 wherein the step of providing a substrate having a surface includes providing a substrate formed of one of a silicon material or a III–V material.

27. A method of forming a device as claimed in claim 26 wherein the step of providing a substrate having a surface includes providing a substrate formed of one of InGaAs, InAlAs, or GaAs.

28. A method of forming a device as claimed in claim 20 wherein the step of providing a low surface energy material layer includes providing a layer formed of material selected from the group consisting of an amorphous fluoropolymer, a semi-crystalline fluoropolymer, a parylene, and a silicone-based material.

29. A method of forming a device as claimed in claim 20 wherein the step of depositing an amorphous carbon layer includes plasma enhanced chemical vapor deposition (PECVD).

30. A method of forming a device as claimed in claim 20 wherein the step of depositing a carbon layer includes sputtering.

31. A method of forming a device as claimed in claim 20 wherein the step of depositing an amorphous carbon layer includes depositing a polymer-like carbon material.

32. A method of forming a device as claimed in claim 20 wherein the step of depositing a carbon layer includes depositing a diamond-like carbon material.

* * * * *